(12) United States Patent
Kaynak et al.

(10) Patent No.: US 11,777,522 B1
(45) Date of Patent: Oct. 3, 2023

(54) BIT FLIPPING DECODER WITH DYNAMIC BIT FLIPPING CRITERIA

(71) Applicant: Micron Technology, Inc., Boise, ID (US)

(72) Inventors: Mustafa N. Kaynak, San Diego, CA (US); Sivagnanam Parthasarathy, Carlsbad, CA (US); Eyal En Gad, Highland, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/706,471

(22) Filed: Mar. 28, 2022

(51) Int. Cl.
*H03M 13/11* (2006.01)
*H03M 13/00* (2006.01)

(52) U.S. Cl.
CPC ...... *H03M 13/1108* (2013.01); *H03M 13/611* (2013.01)

(58) Field of Classification Search
CPC .................. H03M 13/1108; H03M 13/611
See application file for complete search history.

(56) References Cited

U.S. PATENT DOCUMENTS

| | | | |
|---|---|---|---|
| 8,996,972 B1 | 3/2015 | Weiner | |
| 9,214,958 B2 | 12/2015 | Xiong et al. | |
| 9,619,327 B2 | 4/2017 | Ha et al. | |
| 9,934,082 B2 | 4/2018 | Tomishima et al. | |
| 9,998,148 B2 | 6/2018 | Lin et al. | |
| 10,097,208 B2 | 10/2018 | Ilani et al. | |
| 10,180,874 B2 | 1/2019 | Bazarsky et al. | |
| 10,498,362 B2 | 12/2019 | Hanham et al. | |
| 10,707,899 B2 | 7/2020 | Bhatia et al. | |
| 10,877,840 B2 | 12/2020 | Kumar et al. | |
| 10,936,408 B2 | 3/2021 | Wu | |
| 11,018,695 B1 | 5/2021 | Zhang et al. | |
| 11,063,607 B2 | 7/2021 | Palangappa et al. | |
| 11,082,069 B1 | 8/2021 | Steiner et al. | |
| 11,108,407 B1 | 8/2021 | Lu et al. | |
| 11,146,290 B1 * | 10/2021 | Xiong | H03M 13/1111 |
| 11,146,291 B2 | 10/2021 | Gad et al. | |
| 11,349,498 B2 | 5/2022 | Kaynak et al. | |
| 11,381,253 B1 | 7/2022 | Asadi et al. | |

(Continued)

FOREIGN PATENT DOCUMENTS

| | | |
|---|---|---|
| KR | 10-2017-0101368 A | 9/2017 |
| KR | 10-2020-0111509 A | 9/2020 |
| WO | 2016/048495 A1 | 3/2016 |

OTHER PUBLICATIONS

Non-Final Office Action, U.S. Appl. No. 17/397,707, dated Oct. 6, 2022, 9 pages.

(Continued)

*Primary Examiner* — Thien Nguyen
(74) *Attorney, Agent, or Firm* — NICHOLSON DE VOS WEBSTER & ELLIOTT LLP

(57) ABSTRACT

Methods, systems, and apparatuses include receiving a codeword stored in a memory device. Syndrome information and energy function values are determined for bits of the codeword. A bit flipping criterion is selected using the syndrome information from a plurality of values. A bit of the codeword is flipped when the energy function values for a bit of the codeword satisfies the bit flipping criterion. A corrected codeword that results from the flipping of the bits is returned.

20 Claims, 5 Drawing Sheets

(56) References Cited

U.S. PATENT DOCUMENTS

| | | |
|---|---|---|
| 11,398,835 B1 | 7/2022 | Kaynak et al. |
| 2018/0013450 A1 | 1/2018 | Hsiao et al. |
| 2018/0159559 A1 | 6/2018 | Bazarsky et al. |
| 2019/0238158 A1 | 8/2019 | Bhatia et al. |
| 2019/0312593 A1 | 10/2019 | Hsiao et al. |
| 2020/0304155 A1 | 9/2020 | Jeong et al. |
| 2021/0143836 A1 | 5/2021 | Zhang et al. |
| 2021/0143837 A1 | 5/2021 | Asadi et al. |
| 2021/0175900 A1* | 6/2021 | Kuo .................. H03M 13/1148 |

OTHER PUBLICATIONS

Notice of Allowance, U.S. Appl. No. 17/395,024, dated Apr. 8, 2022, 10 pages.

International Search Report and Written Opinion, PCT App. No. PCT/US2022/037195, dated Oct. 21, 2022, 9 pages.

International Search Report and Written Opinion, PCT App. No. PCT/US2022/037201, dated Oct. 27, 2022, 9 pages.

Vasic et al., "Multi-Bit Flipping Algorithms with Probabilistic Gradient Descent", 2017 Information Theory and Application Workshop, IEEE, Feb. 17, 2017 [retrieved on Sep. 26, 2022], Retrieved <https://ieeexplore.ieee.org/abstract/document/8023480>.

Notice of Allowance, U.S. Appl. No. 17/397,707, dated Mar. 15, 2023, 8 pages.

* cited by examiner

BIT FLIPPING DECODER WITH DYNAMIC BIT FLIPPING CRITERIA

TECHNICAL FIELD

The present disclosure generally relates to error correction in memory devices, and more specifically, relates to a bit flipping decoder that selects and uses dynamic bit flipping criteria.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
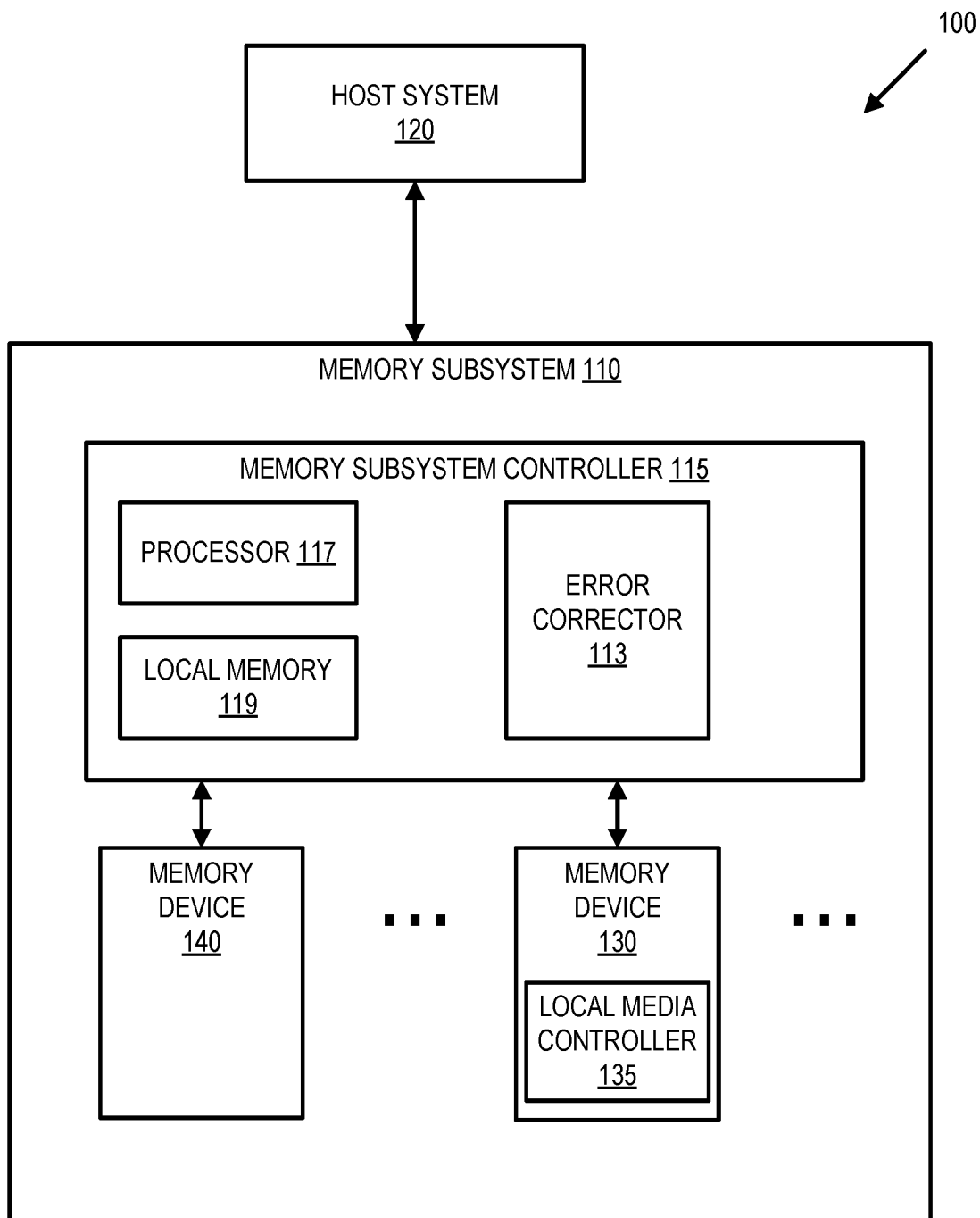
FIG. 1 illustrates an example computing system that includes a memory subsystem in accordance with some embodiments of the present disclosure.

Aspects of the present disclosure are directed to bit flipping decoders based on soft information. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to Shannon channel capacity. LDPC decoders utilize a "belief propagation" algorithm, which is based on the iterative exchange of reliability information, e.g., "beliefs." The MinSum algorithm (MSA), which is a simplified version of the belief propagation algorithm, can be used for decoding LDPC codes. MSA-based decoders use a relatively high amount of energy per bit (e.g., pico-joule per bit) for decoding codewords and hence are not well suited for energy conscious applications (such as mobile applications). Bit Flipping (BF) decoders have been introduced to address this problem. BF decoders use less energy per bit. However, BF decoders provide lower error correction capability when compared to the error correction capability of MSA-based decoders.

A BF decoder is an iterative decoder. Each iteration of the decoding process, the BF decoder uses a bit flipping threshold to decide which bits to flip. The bit flipping threshold (or the flipping criterion) can be selected to make the decoder more/less aggressive in terms of flipping more/less bits. For example, bits can be flipped based on a comparison of an energy function per bit to the bit flipping criterion. The value of the bit flipping criterion dictates the convergence speed of the decoder and, therefore, the number of decoder iterations.

The majority of reads typically will have a low bit error rate but occasionally reads will have a higher bit error rate. At higher bit error rates, the BF decoder uses more iterations to decode than at low bit error rates, resulting in variable latency. A BF decoder uses a fixed bit flipping criterion, which presents a trade-off between latency and performance in terms of false flips (flipping bits that were correct). A more aggressive bit flipping criterion generally reduces the number of iterations, resulting in less latency and higher throughput, but it can also result in higher false flips, resulting in poor performance/higher codeword error rate (CWER), the rate/probability at which a BF decoder fails to correct errors and a sequence of error recovery steps is triggered. This can be acceptable for decoding data with a low bit error rate but becomes unacceptable for data with a higher bit error rate. A less aggressive bit flipping criterion is often selected as it reduces false flips and CWER, which is important for data with a higher bit error rate, but at the cost of increased latency and reduced throughput—e.g., for data with a low bit error rate.

Aspects of the present disclosure address the above and other deficiencies by dynamically adjusting the bit flipping criterion of the BF decoder based on an estimated bit error rate. At higher bit error rates (e.g., where there are many errors in a codeword), a decoder that flips bits less aggressively will have a high correction capability (e.g., a less aggressive flipping criterion will deliver a lower CWER). At lower bit error rates, a decoder can use an aggressive flipping criterion to more aggressively flip bits without risking a significant increase in CWER. The BF decoder can use syndrome information computed by an iteration of the decoding process (e.g., the first iteration) as an estimated bit error rate and set the bit flipping criterion more aggressively for an estimated bit rate at/below a threshold value and less aggressively for an estimated bit rate at/above a threshold value. This dynamic adjustment results in reduced decoder latency, higher decoder throughput, and better quality-of-service (QoS).

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an error corrector 113 that can perform error correction using a bit flipping decoder that flips bits based on dynamic bit flipping criteria. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 120, an application, or an operating system.

In some embodiments, the error corrector 113 is operative to encode and decode data stored in the memory device (e.g., an encoder and/or decoder). Encoding data using an error correcting code (ECC) allows for correction of erroneous data bits when the data is retrieved from the memory device. For example, the error corrector 113 can encode data received from the host system 120 and store the data and parity bits as codewords in the memory device 130. The error corrector 113 can further decode data stored in the memory device 130 to identify and correct erroneous bits of the data before transmitting corrected data to the host system 120. Although illustrated as a single component that can perform encoding and decoding of data, the error corrector 113 can be implemented as two or more separate components. In some embodiments, the error corrector 113 encodes data according to a Low-density parity-check (LDPC) code. The error corrector 113 decodes the codewords stored in the memory device 130 based on/using a BF decoder. As described below, the error corrector 113 implements an enhanced BF decoder that can perform bit flipping decoding based on dynamic bit flipping criteria.

In one embodiment, the error corrector 113 receives a codeword stored in a memory device. The error corrector 113 error corrects the codeword in a set of iterations, e.g., by flipping bits for one or more iterations. The bits are flipped according to comparing an energy function and dynamic bit flipping criteria. Further details with regards to the operations of the error corrector 113 are described below.

In some embodiments, the error corrector 113 implements a BF decoder that uses soft information to error correct codewords. A hard read is a read operation to distinguish between the multiple states to which a memory cell may be programmed. A hard read returns hard data, e.g., a digit ("0" or "1") corresponding to the state determined by the read operation. Soft data associated with a read can be data other than the hard data obtained from the read operation. Some error-correcting code schemes use hard data (e.g., the bits of the codeword itself) to detect and correct errors in a codeword. Other error-correcting code schemes can use hard and soft data to decode a codeword. Use of each of hard data and soft data is described in additional detail below.

In some embodiments, a BF decoder defines an energy function for a bit of a codeword. An energy function assigns an energy function value to each codeword bit. An energy function value of a codeword bit can be considered an indication of reliability information for the codeword bit. In some embodiments, an energy function value of a codeword bit can be determined based on a number of parity violations per codeword bit and channel information. The channel information is determined based on a current state of the bit (after one or more iterations of the BF decoder) versus the bit that was read from a memory device (also referred to as the hard bit). In some embodiments, a high energy function value of a bit (e.g., an energy function value that is greater than or equal to a threshold) is indicative of a more reliable bit and a low energy function value of a bit (e.g., an energy function value that is less than the threshold) is indicative of a less reliable bit. In some embodiments, an energy function is defined such that when the current state of the bit agrees with the bit that was read from the memory device, the bit is considered to be more reliable (e.g., the energy function value of that bit is increased based on whether the current state of the bit and the hard bit agree) and when the current state of the bit does not agree with the bit that was read from the memory device, the bit is considered to be less reliable (e.g., the energy function value of that bit is decreased). A BF decoder flips least reliable bits first. While embodiments will be described with a BF decoder where high energy function values of bits are indicative of high reliable bits and low energy function values are indicative of less reliable bits and the BF decoder flips bits that have lower energy function values, other embodiments can be contemplated. For example, in some instances, high energy function values of bits can be indicative of less reliable bits and low energy function values are indicative of high reliable bits. In this exemplary embodiment, a BF decoder flips least reliable bits first, i.e., bits that have higher energy function values.

Figure 2:
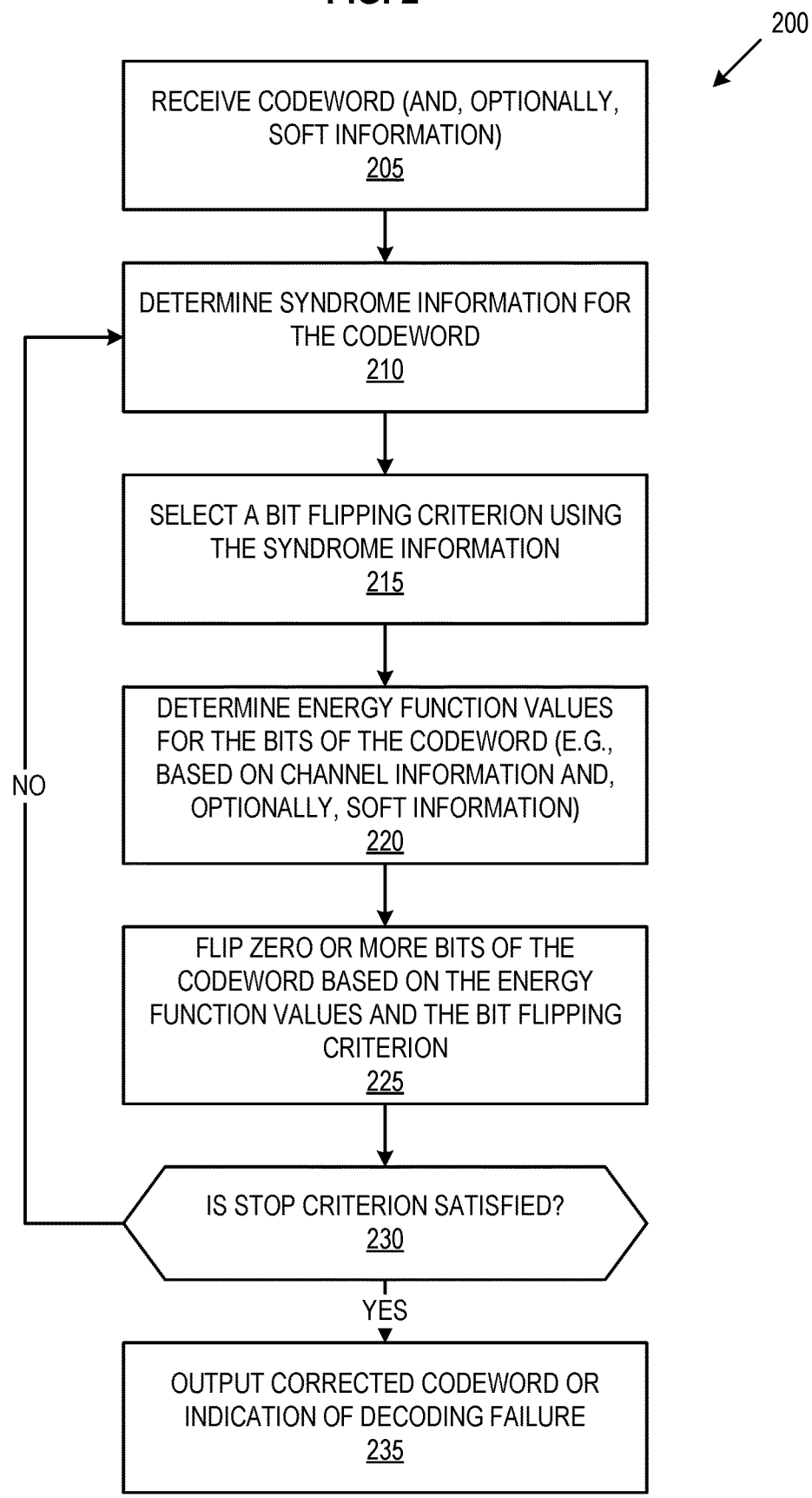
FIG. 2 is a flow diagram of an example method of bit flipping based on dynamic bit flipping criteria, in accordance with some embodiments of the present disclosure.

FIG. 2 is a flow diagram of an example method 200 that provides bit flipping based on dynamic bit flipping criteria. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device receives a codeword from a memory device. In some embodiments, the codeword is received as a result of a read operation from a host system 120. The codeword includes a combination of data bits and parity check bits. The parity check bits are stored in the memory device for the data bits. The data bits and parity check bits are hard data bits that result from a hard read on a memory cell to determine the state of the memory cell (e.g., "0" or "1").

In some embodiments, the processing device also receives soft information for the codeword. The soft information can include bits received from the memory device in addition to the bits of the codeword. In some embodiments, the memory device determines soft information for a hard read. In other embodiments, the memory device does not generate and does not transmit the soft information to the processing device. In some embodiments, the memory device generates and transmits soft information for some but not all codewords it transmits to the processing device. Soft information can indicate a confidence level with regards to a hard data bit. For example, soft information can indicate that there is a high confidence level that a hard data bit is correct, and the hard data bit can be referred to as a strong bit. Alternatively, soft information can indicate that there is a low confidence level in the hard data bit and the hard data bit is referred to as a weak bit.

In some embodiments, soft information is indicative of a particular voltage to which the memory cell is charged (where the memory cell is the one from which the hard data bit is read). For example, a hard data bit is less reliable (i.e., a weak bit) when its associated soft information is indicative of the memory cell is charged to a particular voltage that is near a boundary between two states and a hard data bit is more reliable (i.e., a strong bit) when its associated soft information indicates that the memory cell is charged to a particular voltage near the center of a voltage range corresponding to a state (a "0" or "1"). In some embodiments, the soft information can include a soft bit for each bit of the hard data bit of the codeword. The soft bit of a hard data bit is indicative of whether the hard data bit is a strong or a weak bit. For example, the soft bit can be "0" when its associated hard data bit is weak and "1" when its associated hard data bit is strong. In some embodiments, the number of bits of soft information for a codeword is strictly less than the number of bits of the codeword. For example, the processing device can receive the indices of the strong bits in the codeword. Alternatively, the processing device can receive the indices of the weak bits in the codeword to reduce the amount of information transferred from memory device 130/140 to error corrector 113. In some embodiments, the soft information can include more than one soft bit for each bit of the hard data bit of the codeword. For example, when the soft information includes two soft bits, this results in four reliability levels for a bit such as very weak, weak, strong, and very strong.

At operation 210, the processing device determines syndrome information for the codeword. For example, in a first iteration of decoding the codeword with the bit flipping decoder, the processing device performs one or more parity checks of the data bits and parity check bits. In one embodiment, syndrome information is the number of satisfied parities for the codeword. For example, the processing device can determine a number of satisfied parities per codeword. In another embodiment, syndrome information is the number of unsatisfied parities, i.e., parity violations for the codeword. In yet another embodiment, syndrome information is a value based on the number of satisfied/unsatisfied parities for the codeword, e.g., a weighted number of satisfied/unsatisfied parities, an average number of satisfied/unsatisfied parities for the codeword, a weighted average number of satisfied/unsatisfied parities for the codeword, etc.

At operation 215, the processing device selects a bit flipping criterion using the syndrome information. In one embodiment, the processing device uses the syndrome information as an estimate of bit error rate (referred to herein as a raw bit error rate or RBER) for the bits of the codeword and, therefore, selects a more aggressive or less aggressive bit flipping criterion based on the syndrome information. For example, the processing device can map the number of satisfied/unsatisfied parities for the codeword or weighted number of satisfied/unsatisfied parities for the codeword to a bit flipping criterion value. In one embodiment, the processing device maps a range of satisfied/unsatisfied parity values to a single bit flipping criterion, as shown in FIG. 3.

Figure 3:
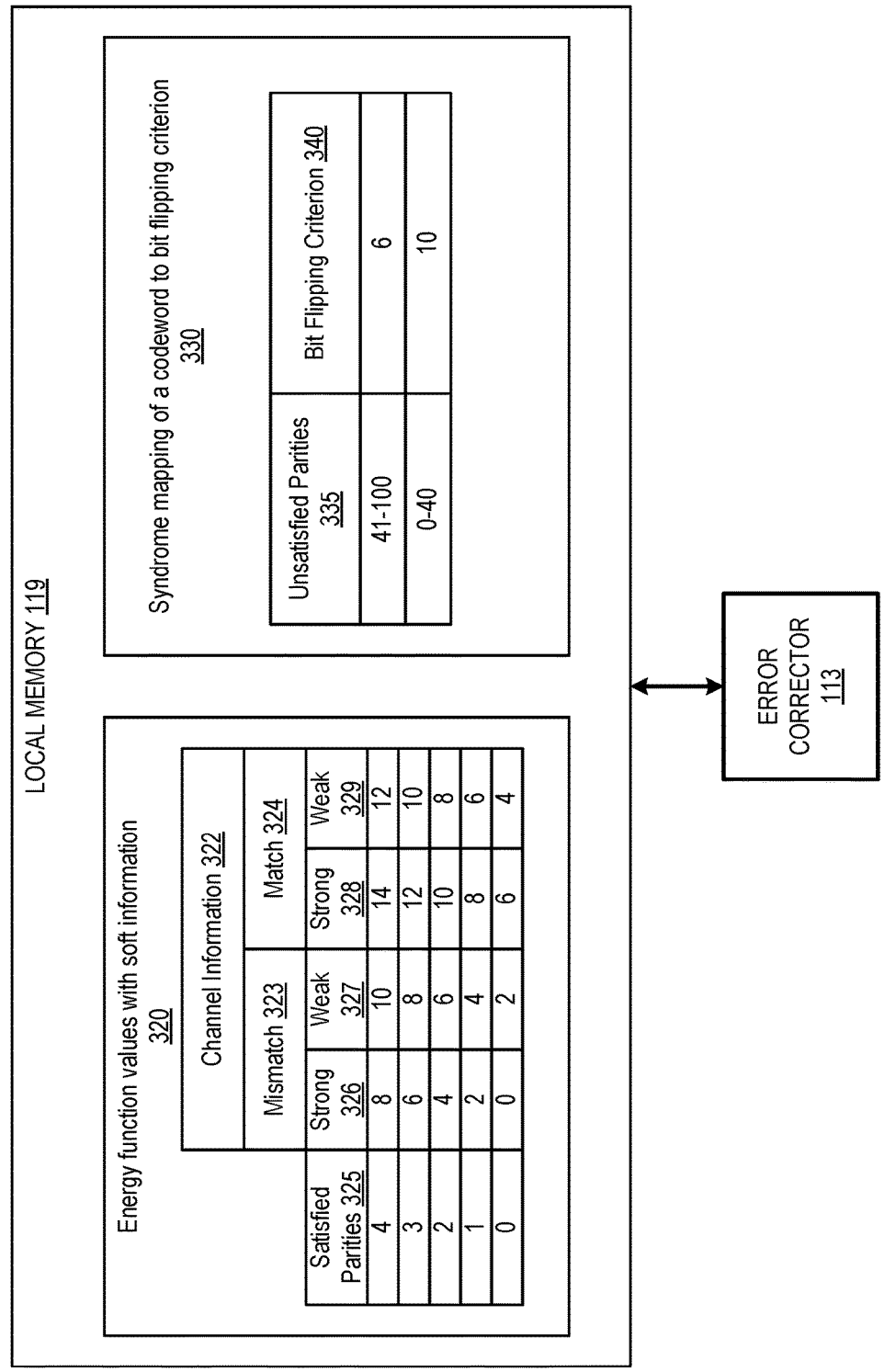
FIG. 3 illustrates a block diagram of exemplary lookup tables that can be used for determining an energy function value and a bit flipping criterion of a bit of a codeword, in accordance with some embodiments.

FIG. 3 illustrates a block diagram of an exemplary lookup table 330 that can be used for selecting a bit flipping criterion using syndrome information for a codeword having, e.g., 100 parity bits. Although FIG. 3 illustrates particular examples of a mapping between a number of unsatisfied parities (i.e., parity violations) and bit flipping criterion values, the illustrated examples should be understood only as examples, other mappings are possible. For example, mappings can include a greater number of unsatisfied parity values, more than two values of bit flipping criterion, one-to-one mappings, etc.

As illustrated, a range of 0-40 unsatisfied parities 335 maps to a bit flipping criterion value 340 of 10. In some embodiments, the bit flipping criterion is a threshold value for an energy function. The processing device determines to flip a bit when the energy function value of the bit satisfies the bit flipping criterion/threshold. For example, the processing device can determine to flip a bit when the energy function value of the bit is less than or equal to the bit flipping criterion/threshold and to not flip the bit when the energy function value of the bit is greater than the bit flipping criterion/threshold. A range of low unsatisfied parities (e.g., 0-40 out of 100 parity bits) represents a codeword with an estimated low RBER. For energy function values that fall within a range of 0-40, a bit flipping criterion of 10 is an aggressive threshold that can lead to a greater number of bit flips per iteration and shorter latency in decoding the codeword. With low estimated RBER, the risk of false flips leading to decoding failure is low.

As illustrated, a range of 41-100 unsatisfied parities 335 maps to a bit flipping criterion value 340 of 6. A range of high unsatisfied parities represents a codeword with an estimated high RBER. For energy function values that fall within a range of 41-100, a bit flipping criterion of 6 is a conservative/less aggressive threshold. As a result, the decoding process includes a smaller number of bit flips per iteration and longer latency in decoding the codeword. With high estimated RBER, however, the risk of false flips leading to decoding failure is high, so the more conservative bit flipping criterion is justified and results in a lower codeword error rate.

Returning to FIG. 2, at operation 220, the processing device determines energy function values for bits of the codeword without soft information for the bits of the codeword. An energy function of a codeword bit can be considered an indication of reliability information for the bit. The processing device can determine an energy function value for a bit of the codeword based on the number of satisfied parities for the bit and channel information for that bit. A higher number of satisfied parities is an indication of a more reliable bit and results in a higher energy function value for the bit. Additionally, a lower number of satisfied parities (more parity violations) is an indication of a less reliable bit and results in a lower energy function value for the bit. The channel information is determined based on a current state of the bit as compared to the state of the bit when it was read from a memory device. For example, the channel information of a bit can be defined as 1-XOR of the current state of the bit, which may have been flipped during one or more iterations of decoding, and the bit as read from the memory device. When the current state of the bit agrees with the bit that was read from the memory device, the bit is considered to be more reliable. Therefore, an energy function value of a bit is greater when the current state of the bit agrees with the hard bit received from the memory device than when the current state of the bit has been flipped and does not agree with the hard bit. In some embodiments, an energy function of a bit can be determined by adding a number of satisfied parities of the bit with channel information for the bit. In a non-limiting example, an energy function can be determined according to equation (1):

$$e(bit) = \text{NumberSatisfiedParities}(bit) + \text{Channel information}(bit) \quad (1)$$

Where higher e(bit) indicates a more reliable bit and lower e(bit) indicates a less reliable bit.

In one embodiment, the processing device determines the energy function value of a bit of the codeword by retrieving the energy function value from a look up table based on the number of satisfied parity bits and whether there is a match or a mismatch between the current state of a bit and the hard bit received from the memory device. FIG. 3 illustrates a block diagram of an exemplary lookup table 320 that can be used for determining energy function values of a bit of a codeword, in accordance with some embodiments. Although FIG. 3 illustrates particular examples of number of satisfied parities and energy function values of a bit of a codeword, the illustrated examples should be understood only as examples, other energy function values and/or satisfied parity numbers are possible. Additionally, exemplary lookup table 320 illustrates energy function values based on soft information. Other embodiments determine energy function values for bits of a codeword using syndrome and channel information but without soft information. Energy function values determined without soft information are referred to herein as default energy function values.

In embodiments in which the processing device determines energy function values for the bits of the codeword using soft information, the processing device determines an energy function value for a bit of the codeword using or otherwise based on the number of satisfied parities for the bit, channel information for that bit, and further based on the soft information associated with the bit. In some embodiments, an energy function value of a bit can be determined as described above and adjusted according to the soft information. For example, the default energy function value of a bit (e(bit)) can be determined according to equation (1) and the processing device determines, based on whether the current state of the bit matches or does not match the hard bit whether to add a soft information offset, subtract a soft information offset, or not apply a soft information offset.

In one embodiment, the offset is added to the default energy function for a bit to increase the energy function value when the soft information indicates that the bit is strong, and the current state of the bit matches the hard bit that is received from the memory device. Additionally, the offset is subtracted from the default energy function value when the soft information indicates that the bit is strong, and the current state of the bit does not match the hard bit. Further, when the soft information indicates that the bit is weak, no offset is applied and the energy function value of the bit is the default energy function value. While embodiments are described with an offset applied when the soft information indicates that a bit is strong, in other embodiments, the offset is applied when the soft information indicates that a bit is weak.

In one embodiment, the processing device determines the energy function value of a bit of the codeword by retrieving the energy function value from a look up table based on the number of satisfied parity bits, whether there is a match or a mismatch between the current state of a bit and the hard bit received from the memory device, and further based on the soft information associated with the bit. Table 320 includes exemplary energy function values that can be used for bits of a codeword. The processing device determines an energy function value for a bit based on its associated number of satisfied parities 325, channel information 322 (whether the current state of the bit is a match 324 or a mismatch 323 to the hard bit), and on whether the soft information indicates that confidence in the hard bit is strong 326/328 or weak 327/329. In the illustrated example, the energy function values associated with weak bits are the default energy function values (e.g., as determined using equation (1)). Thus, when the hard bit is weak, the energy function value of the bit is determined based on the syndrome information and the channel information. For example, if a bit of the codeword has 4 satisfied parities 325 and its current state is mismatched 323 with the hard bit received from the memory device and its soft information indicates that it is weak 327, the processing device determines that the energy function value of the bit is 10. In another example, if a bit of the codeword has 4 satisfied parities 325, its current state matches 324 with the hard bit received from the memory device and its soft information indicates that it is weak 329, the processing device determines that the energy function value of the bit is 12.

In contrast, the energy function values associated with strong bits are adjusted by adding or subtracting an offset to the default energy function values. As illustrated, when the hard bit is strong, the processing device determines the energy function value of the bit by adding an offset to the default energy function value when there is a match between the hard bit and the current state of the bit. Additionally, when the hard bit is strong, the processing device determines the energy function value of the bit by subtracting an offset from the default energy function value when there is a mismatch between the hard bit and the current state of the bit. For example, if a bit of the codeword has 4 satisfied parities 325 and its current state is mismatched 323 with the hard bit received from the memory device and its soft information indicates that the hard bit is strong 326, the processing device determines that the energy function value of the bit is 8 (which is the default energy function value 10 from which the offset of 2 is subtracted). In another example, if a bit of the codeword has 4 satisfied parities 325, its current state matches 324 with the hard bit received from the memory device and its soft information indicates that the hard bit is strong 328, the processing device determines that the energy function value of the bit is 14 (which corresponds to the default energy function value 10 to which the offset of 2 is added).

Adjusting the energy function value of a bit based on the soft information for the hard bit allows the processing device to distinguish between strong bits and weak bits and reinforces the reliability of the strong bits. For example, increasing the energy function of a strong bit when there is match increases the reliability of the bit and decreases the likelihood that the processing device will flip that bit away from the hard bit value. Similarly, decreasing the energy function of the strong bit when there is mismatch decreases the reliability of the bit and increases the likelihood of flipping that bit back to the hard bit value. The adjustment of the energy function values based on soft information increases correction capability of a BF decoder.

At operation 225, the processing device flips zero or more bits of the codeword when the energy function values for a bit of the codeword satisfies a bit flipping criterion. The processing device traverses the codeword according to a predetermined order and evaluates each bit of the codeword based on its associated energy function value to determine whether to flip the bit or not. When the energy function value of a bit of the codeword does not satisfy the bit flipping criterion, the processing device does not flip the bit. When the energy function value of a bit of codeword satisfies the bit flipping criterion, the processing device flips the bit. As described above, the processing device determines to flip a bit when the energy function value of the bit satisfies the bit flipping criterion/threshold. For example, the processing device can determine to flip a bit when the energy function value of the bit is less than or equal to the bit flipping threshold and to not flip the bit when the energy function value of the bit is greater than the bit flipping threshold.

At operation 230, the processing device determines whether a stop criterion is satisfied. A stop criterion can include an indication that no errors are detected for the codeword. In some embodiments, the stop criterion can include a null syndrome (i.e., zero unsatisfied parities) indicating that the codeword no longer includes erroneous bits. In some embodiments, the stop criterion can include a maximum number of iterations or a maximum amount of time. For example, the processing device is operative to perform the maximum number of iterations (e.g., 30 iterations, 40 iterations, 100 iterations, etc.), and when this number of iterations is reached without a null syndrome, the processing device fails to correct the bit errors in the codeword. When the stop criterion is not satisfied, the processing device performs another iteration. For example, when the stop criterion is not satisfied, the method 200 returns to operation 210 to determine updated syndrome information, an updated bit flipping criterion, updated energy function values, etc. When the stop criterion is satisfied, the method 200 proceeds to operation 235.

At operation 235, the processing device outputs the corrected codeword (e.g., when there are zero unsatisfied parities) or an indication of failure (e.g., when the processing device was unable to decode the codeword). For example, the processing device can transmit the corrected codeword or the indication of failure to the host 120.

Figure 4:
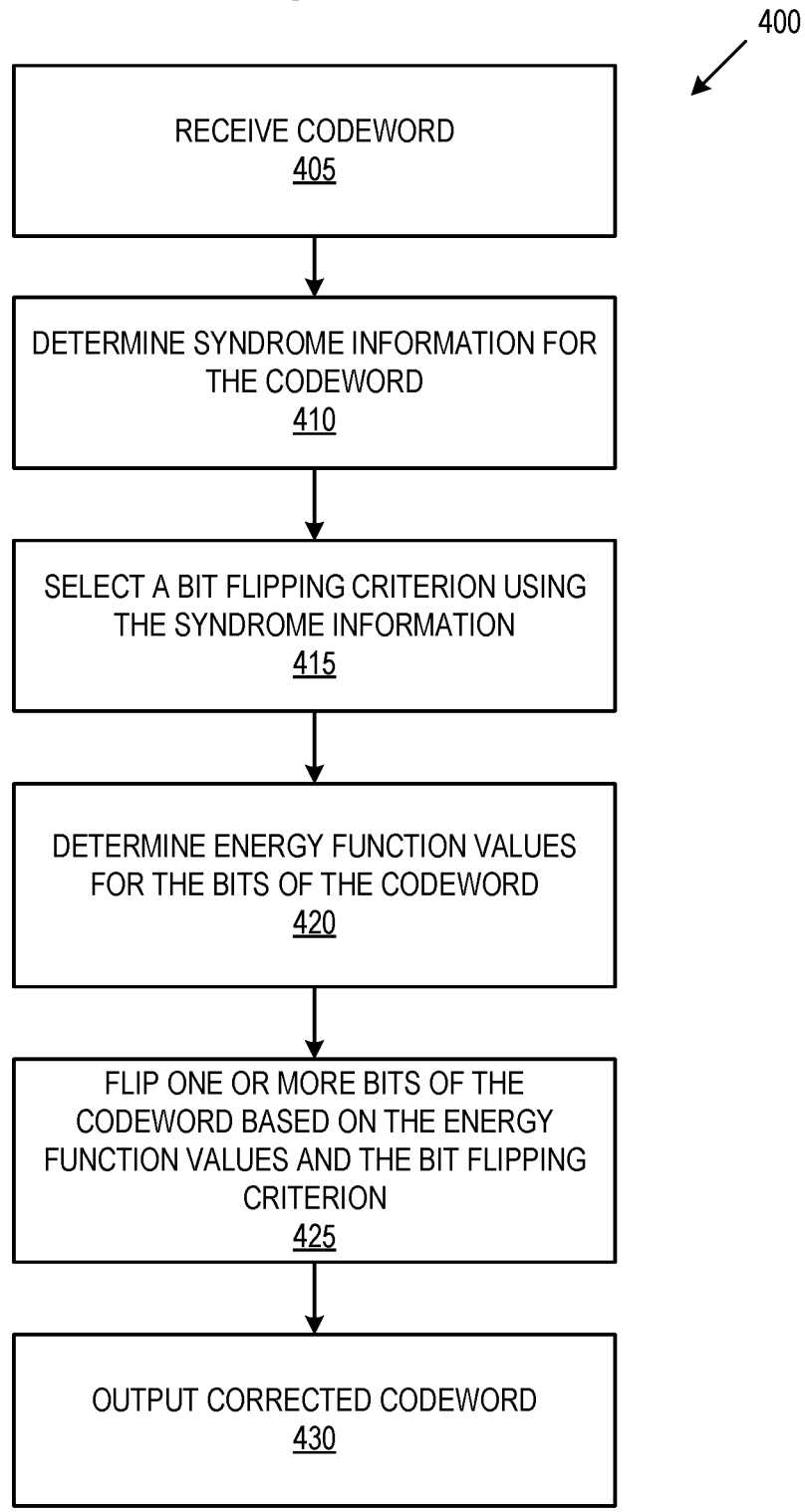
FIG. 4 is a flow diagram of another example method of bit flipping based on dynamic bit flipping criteria, in accordance with some embodiments of the present disclosure.

FIG. 4 is a flow diagram of another example method 400 of bit flipping based on dynamic bit flipping criteria. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a codeword from a memory device. Similar to operation 205, the codeword can be received as a result of a read request from a host system 120 and the codeword includes a combination of data bits and parity check bits. In some embodiments, the processing device also receives soft information for the codeword as described above.

At operation 410, the processing device determines syndrome information for the codeword. For example, in a first iteration of decoding the codeword with the bit flipping decoder, the processing device performs one or more parity checks. The processing device determines syndrome information as described above with reference to operation 210.

At operation 415, the processing device selects a bit flipping criterion using the syndrome information. For example, the processing device maps a number of satisfied/unsatisfied parities to a bit flipping criterion or otherwise selects a bit flipping criterion as described above with reference to operation 215.

At operation 420, the processing device determines energy function values for bits of the codeword. In embodiments that use soft information, the energy function value of a bit can be determined according to a default energy function value that is adjusted or not based on whether the bit is a strong bit or a weak bit. For example, the determination of the energy function values can be performed as described above with reference to operation 220.

At operation 425, the processing device flips a bit of the codeword when the energy function values for a bit of the codeword satisfies a bit flipping criterion. Flipping the bits can be performed as described above with reference to operation 225. For example, when a bit of codeword does not satisfy the bit flipping criterion, the bit is not flipped. When a bit of codeword does satisfies the bit flipping criterion, the bit is flipped.

At operation 430, the processing device returns a corrected codeword that results from the flipping of the bits of the codeword. In some embodiments, the corrected codeword is output to a host in response to a request to read data from the memory device. For example, the processing device returns the corrected codeword as described above with reference to operation 235.

Figure 5:
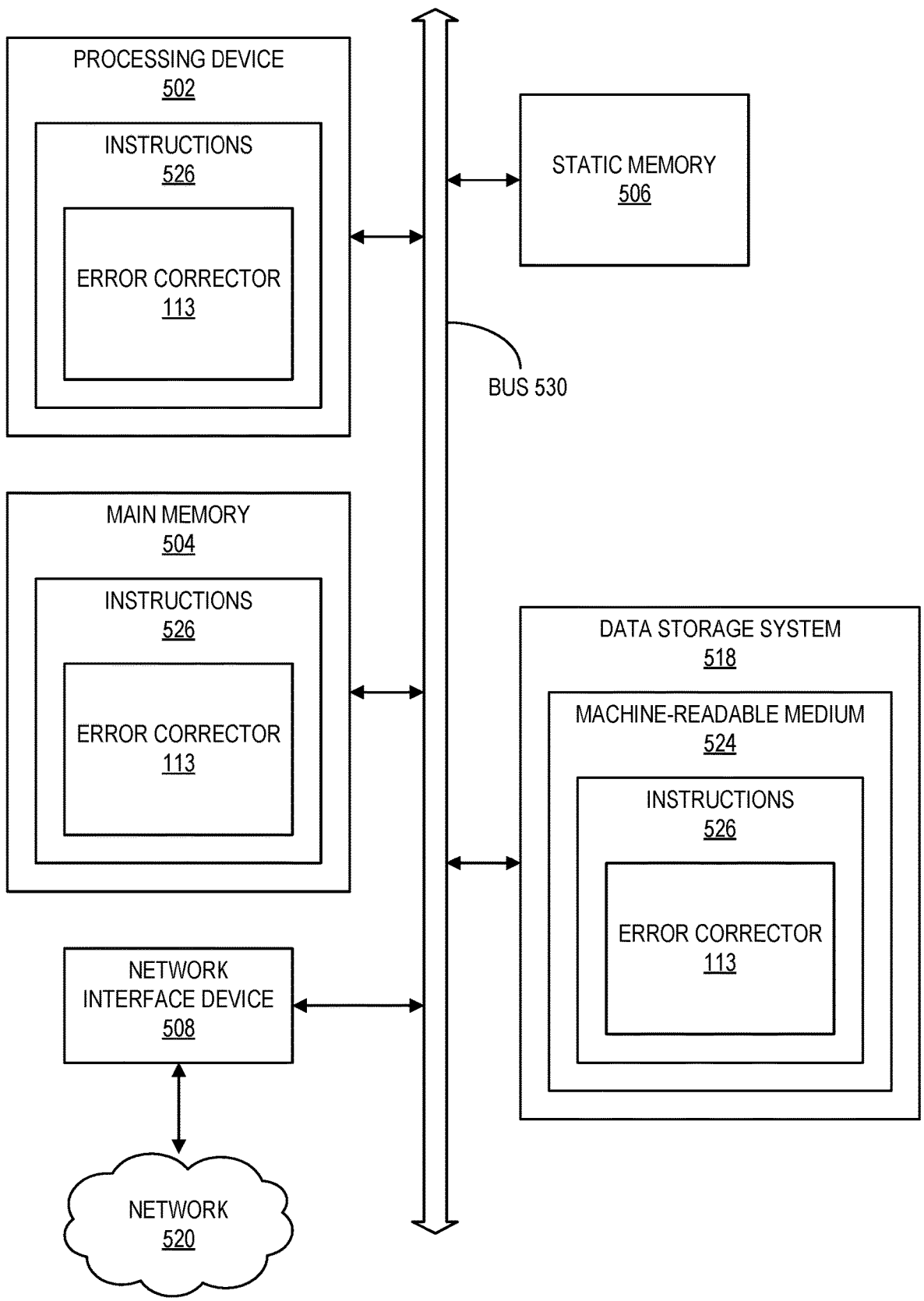
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to an error corrector (e.g., the error corrector 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 200 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a codeword stored in a memory device;
   determining syndrome information for the codeword;
   selecting, from a plurality of values, a bit flipping threshold by mapping the syndrome information to the bit flipping threshold;
   determining energy function values for bits of the codeword;
   flipping each of one or more bits of the codeword in response to the energy function value for the bit satisfying the bit flipping threshold; and
   returning a corrected codeword that results from the flipping of the bits of the codeword.

2. The method of claim 1, wherein the syndrome information is a number of parity violations detected in the codeword.

3. The method of claim 1, wherein selecting the bit flipping threshold includes mapping the syndrome information to a range of parity violations and mapping the range of parity violations to the bit flipping threshold.

4. The method of claim 1, wherein the corrected codeword results from multiple iterations of decoding, the multiple iterations including a first iteration and a second iteration, and wherein the syndrome information is determined during the first iteration, the method further comprising:
   determining, during the second iteration, updated syndrome information for the codeword;
   selecting, from the plurality of values during the second iteration, an updated bit flipping threshold using the updated syndrome information;
   determining, during the second iteration, an updated energy function values for bits of the codeword; and
   flipping each of one or more bits of the codeword, during the second iteration, in response to the updated energy function value for the bit satisfying the updated bit flipping threshold, wherein the corrected codeword further results from the flipping of the bits of the codeword during the second iteration.

5. The method of claim 1, further comprising:
   receiving soft information for the codeword from the memory device, wherein the soft information indicates whether one or more bits of the codeword are strong or weak; and
   responsive to determining that the soft information indicates that a first bit of the codeword is strong and that a current state of the first bit is different from a state of the first bit as read from the memory device, decreasing a default energy function value to obtain an energy function value for the first bit.

6. The method of claim 1, further comprising:
   receiving soft information for the codeword from the memory device, wherein the soft information indicates whether one or more bits of the codeword are strong or weak; and
   responsive to determining that the soft information indicates that a second bit of the codeword is strong and that a current state of the second bit is the same as a state of the second bit as read from the memory device, increasing a default energy function value to obtain an energy function value for the second bit.

7. The method of claim 1, wherein determining the energy function values for bits of the codeword includes:
   retrieving an energy function value for a bit of the codeword from a look up table based on a number of satisfied parity checks, whether a current state of the bit is the same as a state of the bit as read from the memory device, and soft information associated with the bit.

8. A non-transitory computer-readable storage medium comprising instructions that, when executed by a processing device, cause the processing device to:
   receive a codeword stored in a memory device;
   determine syndrome information for the codeword;
   select, from a plurality of values, a bit flipping threshold by mapping the syndrome information to the bit flipping threshold;
   determine energy function values for bits of the codeword;
   flip each of one or more bits of the codeword in response to the energy function value for the bit satisfying the bit flipping threshold; and
   return a corrected codeword that results from the flipping of the bits of the codeword.

9. The non-transitory computer-readable storage medium of claim 8, wherein the syndrome information is a number of parity violations detected in the codeword.

10. The non-transitory computer-readable storage medium of claim 8, wherein selecting the bit flipping threshold includes mapping the syndrome information to a range of parity violations and mapping the range of parity violations to the bit flipping threshold.

11. The non-transitory computer-readable storage medium of claim 8, wherein the corrected codeword results from multiple iterations of decoding, the multiple iterations including a first iteration and a second iteration, wherein the syndrome information is determined during the first iteration, and wherein the processing device is further to:

determine, during the second iteration, updated syndrome information for the codeword;

select, from the plurality of values during the second iteration, an updated bit flipping threshold using the updated syndrome information;

determine, during the second iteration, an updated energy function values for bits of the codeword; and flip each of one or more bits of the codeword, during the second iteration, in response to the updated energy function value for the bit satisfying the updated bit flipping threshold, wherein the corrected codeword further results from the flipping of the bits of the codeword during the second iteration.

12. The non-transitory computer-readable storage medium of claim 8, wherein the processing device is further to:

receive soft information for the codeword from the memory device, wherein the soft information indicates whether one or more bits of the codeword are strong or weak; and responsive to determining that the soft information indicates that a first bit of the codeword is strong and that a current state of the first bit is different from a state of the first bit as read from the memory device, decrease a default energy function value to obtain an energy function value for the first bit.

13. The non-transitory computer-readable storage medium of claim 8, wherein the processing device is further to:

receive soft information for the codeword from the memory device, wherein the soft information indicates whether one or more bits of the codeword are strong or weak; and responsive to determining that the soft information indicates that a second bit of the codeword is strong and that a current state of the second bit is the same as a state of the second bit as read from the memory device, increase a default energy function value to obtain an energy function value for the second bit.

14. The non-transitory computer-readable storage medium of claim 8, wherein determining the energy function values for bits of the codeword includes:

retrieving an energy function value for a bit of the codeword from a look up table based on a number of satisfied parity checks, whether a current state of the bit is the same as a state of the bit as read from the memory device, and soft information associated with the bit.

15. A system comprising:
a memory device; and
a processing device, operatively coupled with the memory device, to:

receive a codeword stored in a memory device;

determine a number of parity violations for the codeword;

select, from a plurality of values, a bit flipping threshold by mapping the number of parity violations to the bit flipping threshold;

determine energy function values for bits of the codeword;

flip each of one or more bits of the codeword in response to the energy function value for the bit satisfying the bit flipping threshold; and return a corrected codeword that results from the flipping of the bits of the codeword.

16. The system of claim 15, wherein selecting the bit flipping threshold includes mapping the number of parity violations to a range of parity violations and mapping the range of parity violations to the bit flipping threshold.

17. The system of claim 15, wherein the corrected codeword results from multiple iterations of decoding, the multiple iterations including a first iteration and a second iteration, wherein the number of parity violations is determined during the first iteration, and wherein the processing device is further to:

determine, during the second iteration, updated syndrome information for the codeword;

select, from the plurality of values during the second iteration, an updated bit flipping threshold using the updated syndrome information;

determine, during the second iteration, an updated energy function values for bits of the codeword; and flip each of one or more bits of the codeword, during the second iteration, in response to the updated energy function value for the bit satisfying the updated bit flipping threshold, wherein the corrected codeword further results from the flipping of the bits of the codeword during the second iteration.

18. The system of claim 15, wherein the processing device is further to:

receive soft information for the codeword from the memory device, wherein the soft information indicates whether one or more bits of the codeword are strong or weak; and responsive to determining that the soft information indicates that a first bit of the codeword is strong and that a current state of the first bit is different from a state of the first bit as read from the memory device, decrease a default energy function value to obtain an energy function value for the first bit.

19. The system of claim 15, wherein the processing device is further to:

receive soft information for the codeword from the memory device, wherein the soft information indicates whether one or more bits of the codeword are strong or weak; and responsive to determining that the soft information indicates that a second bit of the codeword is strong and that a current state of the second bit is the same as a state of the second bit as read from the memory device, increase a default energy function value to obtain an energy function value for the second bit.

20. The system of claim 15, wherein determining the energy function values for bits of the codeword includes:

retrieving an energy function value for a bit of the codeword from a look up table based on a number of satisfied parity checks, whether a current state of the bit is the same as a state of the bit as read from the memory device, and soft information associated with the bit.

\* \* \* \* \*